(12) United States Patent
Takine

(10) Patent No.: US 8,552,453 B2
(45) Date of Patent: Oct. 8, 2013

(54) LIGHT EMITTING DEVICE

(75) Inventor: Kenji Takine, Anan (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 13/266,356

(22) PCT Filed: Jun. 21, 2010

(86) PCT No.: PCT/JP2010/060491
§ 371 (c)(1),
(2), (4) Date: Oct. 26, 2011

(87) PCT Pub. No.: WO2010/150754
PCT Pub. Date: Dec. 29, 2010

(65) Prior Publication Data
US 2012/0037944 A1 Feb. 16, 2012

(30) Foreign Application Priority Data
Jun. 22, 2009 (JP) .................. 2009-147353

(51) Int. Cl.
*H01L 33/50* (2010.01)
*H01L 33/58* (2010.01)
(52) U.S. Cl.
USPC ............ 257/98; 257/E33.072; 257/E33.061
(58) Field of Classification Search
USPC ............... 257/98, E33.072, E33.061
See application file for complete search history.

(56) References Cited

U.S. PATENT DOCUMENTS

| 6,960,878 | B2 | 11/2005 | Sakano et al. |
| 7,342,357 | B2 | 3/2008 | Sakano et al. |
| 7,579,629 | B2 * | 8/2009 | Inoguchi .................. 257/98 |
| 2003/0080341 | A1 | 5/2003 | Sakano et al. |
| 2005/0224821 | A1 | 10/2005 | Sakano et al. |
| 2005/0280019 | A1 | 12/2005 | Konno |
| 2007/0182323 | A1 * | 8/2007 | Ogata et al. .................. 313/512 |
| 2007/0205425 | A1 | 9/2007 | Harada |
| 2007/0262332 | A1 | 11/2007 | Kong |

FOREIGN PATENT DOCUMENTS

| JP | 2006-12868 A | 1/2006 |
| JP | 2007-42749 A | 2/2007 |
| JP | 2007-73825 A | 3/2007 |
| JP | 2007-306002 A | 11/2007 |
| JP | 2009-206468 A | 9/2009 |
| WO | WO02/059982 A1 | 8/2002 |

* cited by examiner

*Primary Examiner* — Matthew W Such
*Assistant Examiner* — Monica D Harrison
(74) *Attorney, Agent, or Firm* — Global IP Counselors, LLP

(57) ABSTRACT

A light emitting device, which has: a light emitting element; a package that comprises a concavity for holding the light emitting element, and that has on its side wall where the concavity is integrally formed a light reflector for reflecting light from the light emitting element and a light transmitter for transmitting light from the light emitting element to the outside.

27 Claims, 8 Drawing Sheets

LIGHT EMITTING DEVICE

CROSS-REFERENCE TO RELATED APPLICATIONS

This national phase application claims priority to Japanese Patent Application No. 2009-147353 filed on Jun. 22, 2009. The entire disclosure of Japanese Patent Application No. 2009-147353 is hereby incorporated herein by reference.

TECHNICAL FIELD

This invention relates to a light emitting device, and more particularly to a surface-mount type of light emitting device used in lighting fixtures, displays, portable telephone backlights, auxiliary light sources for moving picture illumination, and other general, consumer-use light sources.

BACKGROUND ART

A light emitting device with a light emitting diode (LED) or other such light emitting element generally is compact, has good power efficiency, and emits light in vivid colors. Also, since this light emitting element is a semiconductor element, there is no worry about bulb breakage or the like. Furthermore, it has excellent initial drive characteristics, and withstands repeated switching on and off and vibration. Because of these outstanding characteristics, light emitting devices with an LED, a laser diode (LD), or other such light emitting element are used as various kinds of light source.

A light emitting device comprises a light emitting element, conductive members that are electrically connected to the light emitting element, a molded resin (package) that covers the majority of the conductive members, and a translucent sealing resin that covers the light emitting element. A concavity is formed in the molded resin, and the light emitting element is placed on the conductive members located on the bottom of the concavity. The electrodes of the light emitting element are connected by wires to the conductive members, after which the concavity is filled with a translucent sealing resin in which a fluorescent material has been dispersed.

JP-2007-306002-A discloses a light emitting device comprising such a concavity, wherein the depth of the cavity (concavity) is minimized to no more than 450 µm. Making the concavity shallower prevents the loss of light in the interior of the package due to light absorption or scattering, and this enhances the emission efficiency of the light emitting device.

SUMMARY

When the concavity is made shallower, however, this lowers the volume of the concavity, so when the translucent sealing resin is packed inside the concavity, if the amount of translucent sealing resin used varies from one light emitting device to the next, the surface of the light emitting element or the wires may be exposed from the translucent sealing resin, or the translucent sealing resin may overflow the concavity, creating a convex shape that sticks out on the light emitting face side. Thus, a problem with light emitting devices was that the shape of the translucent sealing resin was not consistent, and this led to variance in the light distribution.

In view of this, it is an object of the present invention to provide a light emitting device with which variance in light distribution can be kept to a minimum, while light-emission efficiency and light distribution can be further enhanced.

To achieve the stated object, the light emitting device pertaining to one aspect of the present invention, which has: a light emitting element; a package that comprises a concavity for holding the light emitting element, and that has on its side wall where the concavity is integrally formed a light reflector for reflecting light from the light emitting element and a light transmitter for transmitting light from the light emitting element to the outside.

Another light emitting device has: a light emitting element; a package that comprises a concavity for holding the light emitting element, and that has on its side wall where the concavity is formed a light reflector for reflecting light from the light emitting element and a light transmitter for transmitting light from the light emitting element to the outside; and a translucent sealing resin that is packed on the inside of the concavity.

With these light emitting devices, it is preferable if a translucent sealing resin is packed inside the concavity.

It is also preferable if the light reflector is formed from a white resin, and the light transmitter is formed from a transparent resin with a light transmissivity of at least 70%.

It is also preferable if the height of the light reflector is at least 100% of the height of the light emitting element.

It is also preferable if the height of the light transmitter is at least 30% of the height of the light reflector.

It is also preferable if the translucent sealing resin contains a fluorescent material.

It is also preferable if the translucent sealing resin is formed from a different material from that of the light transmitter.

With the light emitting device according to one aspect of the present invention, variance in light distribution can be kept to a minimum, while light-emission efficiency and light distribution can be further enhanced.

DETAILED DESCRIPTION OF THE PREFERRED EMBODIMENTS

Figure 1:
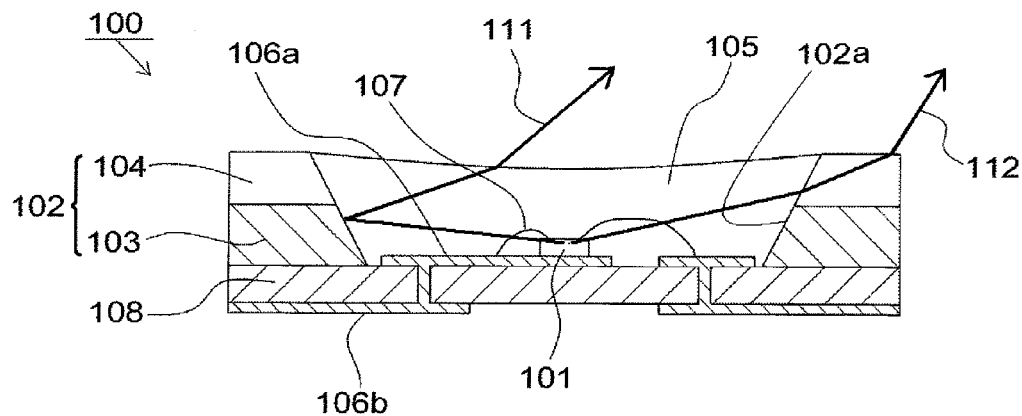
FIG. 1 is a simplified cross section of the light emitting device pertaining to Embodiment 1 of the present invention.

Embodiments of the present invention will now be described through reference to the drawings. However, the embodiments given below are merely examples of a light emitting device for embodying the technological concept of the present invention, and the light emitting device of the present invention is not limited to or by what follows. Also, this Specification in no way limits the members given in the Claims to the members in the embodiments. In particular, the dimensions, materials, and shapes of the constituent parts given in the embodiments, the relative layouts thereof, and so forth should not be construed as limiting the scope of the present invention unless otherwise specified, and are nothing more than illustrative examples. Furthermore, the sizes, positional relations, and so forth of the members shown in the drawings may be exaggerated to make the description clear. In the description that follows, any names or numbers that are the same refer to the same or analogous members, and these may not be described again in detail. In addition, with the various elements that constitute the present invention, a plurality of elements may be constituted by the same member, with a single member serving as a plurality of elements, or conversely, the functions of a single member may be allocated to a plurality of members. Also, what is described in some of the working examples and embodiments can be used in other working examples and embodiments and so on.

Embodiment 1

FIG. 1 is a simplified cross section of the light emitting device 100 of an embodiment of the present invention.

The light emitting device shown in FIG. 1 comprises at least a light emitting element 101 and a package 102 that can control the light distribution from the light emitting element 101.

Package 102

The package 102 contains the light emitting element 101, with the light emitting element 101 being accommodated in the interior, and comprises a concavity 102a that is filled from above with a translucent sealing resin 105. The side wall that form this concavity 102a of the package 102 comprise a light reflector 103 that reflects light from the light emitting element 101, and a light transmitter 104 that transmits light from the light emitting element to the outside.

The light reflector 103 and the light transmitter 104 do not necessarily have to be formed integrally, but they are preferably included integrally in the package. The phrase "included integrally" here means that the side wall of the package 102 is formed from both the light reflector 103 and the light transmitter 104. In other words, it means that the boundary between the light reflector 103 and the light transmitter 104 is in the side wall itself that form the concavity 102a of the package 102. Regardless of whether or not the light reflector 103 and the light transmitter 104 are included integrally in the package, the end faces of the light reflector 103 and the light transmitter 104 are preferably disposed substantially in the same plane as the side wall of the package 102, but may instead constitute a curved surface, for example, or the light reflector 103 and the light transmitter 104 may be inclined at mutually different angles, or may constitute a stepped face.

Some texturing for improving adhesion may be provided at the boundary between the light reflector 103 and the light transmitter 104, or an adhesive material may be interposed between the two.

FIG. 1 is a cross section of a light emitting device, but the hatching indicating a cross section is omitted from transparent portions in order to make the drawing easier to understand. The same applies to FIGS. 3 to 5.

With the package 102, the light reflector 103 is disposed at the lower part of the concavity 102a (the side nearer the face where the light emitting element is mounted), and the light transmitter 104 is disposed at the upper part of the concavity (the side farther away from where the light emitting element is mounted).

The farther down in the concavity 102a of the package 102, the greater the distance to the light emitting face, so the depth of the concavity 102a of the package 102 in which the light reflector 103 and the light transmitter 104 are combined is preferably about 450 to 550 μm, for example. This allows the light emitting device to be more compact, and also allows it to be stably filled with the translucent sealing resin 105.

Light Reflector 103

The light reflector 103 may be formed from a material capable of reflecting light from the light emitting element 101. The light reflector 103 preferably has a reflectivity of at least about 60% with respect to the light from the light emitting element 101, with at least about 80% being even better, and at least about 90% better yet. Examples of favorable materials for forming the light reflector 103 include thermosetting resins, thermoplastic resins, and other such resins. More specifically, examples include epoxy resin compositions, silicone resin compositions, silicone-modified epoxy resins and other such modified epoxy resin compositions, epoxy-modified silicone resins and other such modified silicone resin compositions, polyimide resin compositions, modified polyimide resin compositions, polyphthalamide (PPA), polycarbonate resins, polyphenylene sulfide (PPS), liquid crystal polymers (LCP), ABS resins, phenol resins, acrylic resins, PBT resins, and other such resins.

These resins may also contain titanium oxide, silicon dioxide, titanium dioxide, zirconium dioxide, potassium titanate, alumina, aluminum nitride, boron nitride, mullite, and other such light reflecting substances. This allows the light from the light emitting element 101 to be reflected more efficiently. The amount in which the light reflecting substance is used can be suitably adjusted as dictated by the resin molding method, the resin fluidity, and other such molding conditions, and the reflectivity, mechanical strength, and other such characteristics. For example, it is good to add about 10 to 50 wt %, and preferably 20 to 35 wt %, with respect to the total weight of the light reflector 103. In particular, when titanium oxide is used, the amount is preferably 20 to 40 wt %, and more preferably 25 to 35 wt %, with respect to the total weight of the light reflector 103.

The height of the light reflector 103 is preferably at least about 100% of the height of the light emitting element 101 in order for the light emitted from the light emitting element 101 to be reflected efficiently. No more than about 200% is also preferable. For example, the height of the light reflector 103 is preferably about 130 to 160% of the height of the light emitting element 101. More specifically, with a light emitting element in which this height is 70 to 130 μm, the height of the light reflector 103 is more preferably 100 to 200 μm, and within this range, it is preferable to set the height of the light reflector 103 (the height B in FIG. 2) higher than the height of the light emitting element 101 (the height A in FIG. 2).

The side wall of the light reflector 103 constituting the concavity are preferably inclined so as to widen toward the opening side (the side farther away from the face where the light emitting element is mounted) in order for the light to be reflected efficiently. There are no particular restrictions on the inclination angle in this case, but an example is about 90 to 45° with respect to the top face of the light emitting element.

Also, a reflective film may be disposed on the side wall of the light reflector 103 that constitute the concavity 102a of the package 102 in order to further increase reflectivity. Examples of reflective films include single-layer films and laminated films of gold, silver, platinum, nickel, titanium, aluminum, and other such metals, and oxides, nitrides, and other such inorganic compounds of these metals. The reflective film can be formed by a dry, wet, or other known process, and more specifically by CVD, vacuum vapor deposition, sputtering, or another such method. The reflective film is preferably thick enough for good reflection to occur, such as a thickness of from 10 nm to a few hundred nanometers. For the sake of ease of manufacturing, the reflective film is preferably formed entirely from the same material, but may be partially formed from a different material.

Light Transmitter 104

The light transmitter 104 may be formed from a material capable of transmitting the light from the light emitting element 101 to the outside. The light transmitter 104 preferably has transmissivity of the light from the light emitting element 101 of at least about 70%, with at least about 90% being even better. The material from which the light transmitter 104 is formed may be the same as the material of the light reflector 103, or may be a different material. "Different material" here means that the type and composition are not entirely the same. Examples of favorable materials for forming the light transmitter 104 include thermosetting resins, thermoplastic resins, and other such resins. More specifically, examples include epoxy resin compositions, silicone resin compositions, silicone-modified epoxy resins and other such modified epoxy resin compositions, epoxy-modified silicone resins and other such modified silicone resin compositions, polyimide resin compositions, modified polyimide resin compositions, polyphthalamide (PPA), polycarbonate resins, polyphenylene sulfide (PPS), liquid crystal polymers (LCP), ABS resins, phenol resins, acrylic resins, PBT resins, and other such resins.

A light emitting device with excellent light resistance can be obtained by forming both the light transmitter 104 and the light reflector 103 from a thermoplastic resin. It is particularly favorable for this thermoplastic resin to be an epoxy resin composition, a modified epoxy resin composition, a silicone resin composition, or a modified silicone resin composition.

Because the main purpose of the above-mentioned light reflector 103 is to reflect light, the resin may contain a light reflecting substance, whereas the main purpose of the light transmitter 104 is to suppress light absorption while transmitting light (although reflecting part of it), so the degree of optical transmission can be adjusted by changing the light reflecting substance content, but it is preferable if the light transmitter 104 transmits light without containing any light reflecting substance at all.

The height of the light transmitter 104 is preferably about 30 to 500% of the height of the light reflector 103, for example, and more preferably 30 to 350%, and even more preferably about 50 to 250%. In other words, this height is preferably at least about 30% (and better yet at least about 50%) of the height of the light emitting element 101. It is also preferably no more than about 700% (and better yet no more than about 500%). Furthermore, about 100 to 260% of the height of the light emitting element 101 is even better.

The light transmitter 104 is preferably formed all the way around the side wall that forms the concavity. Disposing the light transmitter 104 in this manner prevents light from the light emitting element from being absorbed and scattered, and allows light distribution to be wider. The light transmitter 104 may be provided to just a pair of opposing side walls. This makes it possible to widen light distribution in just the desired direction.

If the package 102 is formed in this way, as shown in FIG. 1, the light emitted from the light emitting element 101 will be reflected by the light reflector 103, move through the concavity 102a, and be emitted to the outside (111 is the path of the light at this time), or will be incident on the light transmitter 104 and be emitted to the outside (112 is the path of the light at this time). Therefore, even if the concavity 102a of the package 102 is formed deep, light distribution will be controlled by the light reflector 103 while the loss of light inside the package caused by light absorption and scattering can be prevented by the light transmitter 104. This allows the emission efficiency to be raised while maintaining the compact size of the light emitting device, and allows the direction in which light is extracted can be controlled.

Also, since the disposition of the light transmitter 104 allows the concavity 102a to be formed rather deep, the light emitting element surface or wires will not be exposed, these members can be reliably covered with the translucent sealing resin, and deterioration and so forth of these members can be prevented.

Furthermore, even if the packing amount of the translucent sealing resin (discussed below) varies from one light emitting device to the next, the overflowing of the translucent sealing resin from the concavity 102a, and the formation of a bump that sticks out on the light emitting face side can be suppressed. This means that the shape of the translucent sealing resin 105 packed into the concavity 102a will be stable, so variance in light distribution can be further suppressed.

In addition to the members mentioned above, the light emitting device of the illustrated embodiment further comprises the following members. Various configurations of an embodiment including these members will be described in detail below through reference to FIG. 1.

Light Emitting Element 101

The light emitting element 101 used in the embodiment can be any such known element, but it is preferable to use a light emitting diode as the light emitting element 101.

The wavelength of the light emitting element 101 can be selected as desired. For example, ZnSe, a nitride semiconductor ($In_XAl_YGa_{1-X-Y}N$, $0 \leq X$, $0 \leq Y$, $X+Y \leq 1$), and GaP can be used for blue and green light emitting elements. GaAlAs, AlInGaP, and the like can be used for a red light emitting element. A semiconductor light emitting element composed of some other material can also be used. The composition, emission color, size, number, and so forth of the light emitting elements that are used can be suitably selected according to the intended use. Also, a Zener diode or other such protective element may be installed besides a light emitting element.

The light emitting element 101 is mounted on a metal film, a lead frame, or another such conductive member by means of a conductive or nonconductive joining member, and is electrically connected to an external electrode by connection with a wire 107, flip-chip connection, or another such method. Rather than mounting on a conductive member, it may be mounted on a substrate or the like, and electrical connection made with wires or another such connection member.

Translucent Sealing Resin 105

With the light emitting device of the illustrated embodiment, the translucent sealing resin 105 is usually packed on the inside of the concavity 102a of the package 102. That is, in a state in which the light emitting element 101 is placed inside the concavity 102a, the translucent sealing resin 105 is molded inside the concavity 102a. This protects the light emitting element 101 from external force, moisture, and so forth, and also protects the wire 107 and other connecting members.

Examples of resins that can be used as the translucent sealing resin 105 include epoxy resins, silicone resins, acrylic resins, urea resins, and other such transparent resins, glass, and the like that have excellent weather resistance. The transparent resin discussed in WO2002/59982 may also be used, for example.

The translucent sealing resin 105 is preferably formed from a different material from that of the above-mentioned light transmitter 104, and it is particularly favorable if it is formed from a different resin. "Different material" here means that the type and composition are not entirely the same. For example, if we assume that the translucent sealing resin 105 is formed from a specific resin containing a filler or fluorescent substance (discussed below), the light transmitter 104 may be formed from the same resin that does not contain a filler or fluorescent substance.

Even if the translucent sealing resin 105 and the light transmitter 104 are formed from the same type of material and the same composition, if a boundary is formed between the two, the direction in which light is extracted can be changed as compared to when no such boundary exists.

Furthermore, the light distribution in the desired direction can be adjusted by varying the refractive index of the light transmitter 104 and the translucent sealing resin 105. For instance, more light can be extracted from the light transmitter 104, and the light distribution can be widened, by raising the refractive index of the light transmitter 104 over that of the translucent sealing resin 105. If the refractive index of the translucent sealing resin 105 is raised over that of the light transmitter 104, more light can be extracted from the translucent sealing resin 105 side, so the loss of light caused by light absorption and scattering can be kept to a minimum, and the light can be extracted without widening the light distribution.

The translucent sealing resin 105 may contain a fluorescent substance, a filler, a diffuser, or the like.

Fluorescent Substance 110

There are no particular restrictions on the fluorescent substance contained in the translucent sealing resin 105, as long as it is a combination that allows wavelength conversion of all or part of the light emission from the light emitting element 101.

A fluorescent substance suited to obtaining a white light emitting device, which is most in demand today, was described as an example of a fluorescent substance, but this is not the only option, and any known fluorescent substance can be used.

Examples of the fluorescent substance 110 include one or more types selected from (i) nitride-based fluorescent materials and oxynitride-based fluorescent materials that are mainly activated by europium, cerium, or another such lanthanoid element; (ii) alkaline earth halogen apatite fluorescent materials that are mainly activated by europium or other such lanthanoids or manganese or other such transition metal elements; (iii) alkali earth metal haloborate fluorescent materials; (iv) alkali earth metal aluminate fluorescent materials; (v) alkaline earth silicates; (vi) alkaline earth sulfides; (vii) alkaline earth thiogallates; (viii) alkaline earth silicon nitrides; (ix) germanates; (x) rare earth aluminates that are mainly activated by cerium or other such lanthanoid elements; (xi) organic materials that are mainly activated by europium or other such lanthanoid elements or rare earth silicates; and (xii) organic complexes. The fluorescent substances and so forth discussed in WO2002/59982 may also be used, for example.

When a light emitting device capable of emitting white light is to be obtained, the white light is adjusted to white by means of the type and concentration of the fluorescent substance 110 contained in the translucent sealing resin 105.

Figure 2:
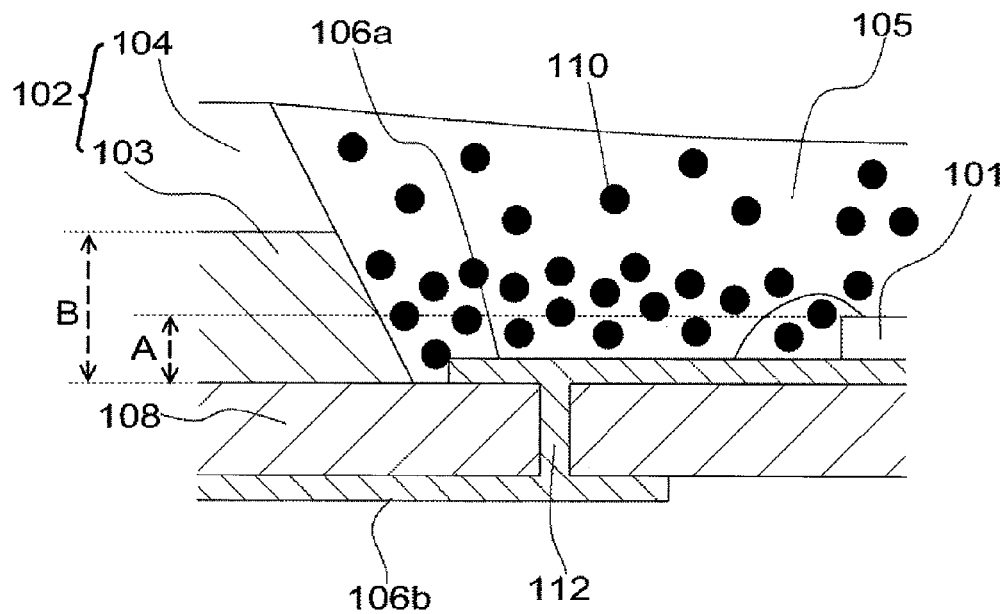
FIG. 2 is a detail enlargement of the light emitting device in FIG. 1.

For example, as shown in FIG. 2, the fluorescent substance 110, a filler, or the like is added ahead of time as desired to the translucent sealing resin 105, and this translucent sealing resin 105 is packed inside the concavity 102a of the package 102. The packing here can be accomplished by printing, potting, or any of various other methods if the composition is a liquid, but a method in which the composition is dropped onto the light emitting element 101 by potting and packed inside the concavity 102a is favorable. The fluorescent substance settles under its own weight in the liquid phase, so a highly uniform sedimentation layer containing the fluorescent substance can be formed by dispersing in the liquid phase and allowing a uniformly packed suspension to stand. For example, as shown in FIG. 2, the fluorescent substance 110 is made to settle so as to be more prevalent in the portion near the light emitting element 101 within the translucent sealing resin 105, and the translucent sealing resin is cured in a state such that at least 90% of the fluorescent substance is disposed at a position that is lower than the height of the light reflector 103 (the height B in FIG. 2), which allows the excitation efficiency to be further raised with respect to the amount of fluorescent material. Also, the fluorescent substance 110 can be easily made to settle by adjusting the concentration in which the fluorescent substance 110 is contained in the translucent sealing resin 105 to 30 wt % or less, for example.

There are no particular restrictions on the filler, diffuser, etc., and the known substances discussed in WO2002/59882, etc., can be used for example.

Substrate 108

With the light emitting device of the illustrated embodiment, the light emitting element 101 is usually placed on a substrate 108. Also, the package 102 is disposed on the substrate 108 so as to surround the light emitting element 101. This substrate 108 may be formed from any material, so long as it is a material that has suitable mechanical strength and insulation properties. For instance, a BT resin, glass epoxy, ceramic, or the like can be used. Also, multiple layers of an epoxy resin sheet may be laminated together.

Internal wiring 106a, which is used as a negative electrode and a positive electrode for electrical connection with the light emitting element 101, is formed on the substrate 108, and is electrically connected to an external electrode 106b. For example, as shown in FIG. 2, the internal wiring 106a and the external electrode 106b are connected by a through-hole 112. The internal wiring 106a and the external electrode 106b can be constituted by Cu/Ni/Ag, for example. The outermost surface of the internal wiring 106a is preferably composed of a reflective face that reflects light. Also, particularly when a resin with relatively high gas permeability, such as a silicone resin, is used as the translucent sealing resin 105, an insulating, transparent protective film composed of $Al_2O_3$ and $SiO_2$ may be formed covering the reflective face (such as a silver face) in order to reduce discoloration caused by sulfiding of the silver on the outermost surface of the internal wiring 106a, etc.

Method for Manufacturing Light Emitting Device 100

The light emitting device of Embodiment 1 can be manufactured by the method shown in FIGS. 6a to 6e.

1. Composite Substrate

In this embodiment, a composite substrate, in which a plurality of substrates are joined together until the translucent sealing resin 105 is cured, is used so as to manufacture a plurality of light emitting devices in one lot. With this composite substrate, as shown in FIG. 6a, the internal wiring 106a and the external electrode 106b are formed on the surfaces of the substrate 108.

2. Formation of Light Reflector 103

Figure 6:
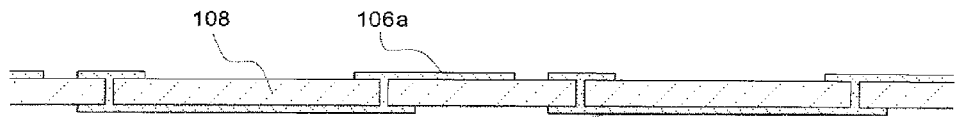
FIG. 6 consists of diagrams illustrating a method for manufacturing the light emitting device pertaining to Embodiment 1.
Figure 6:
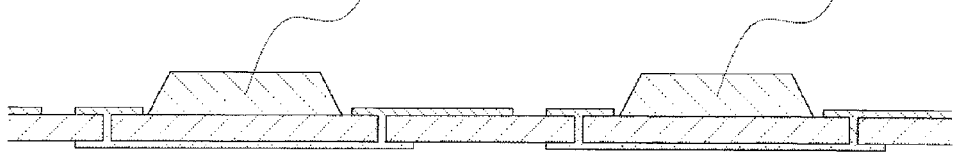
Figure 6:
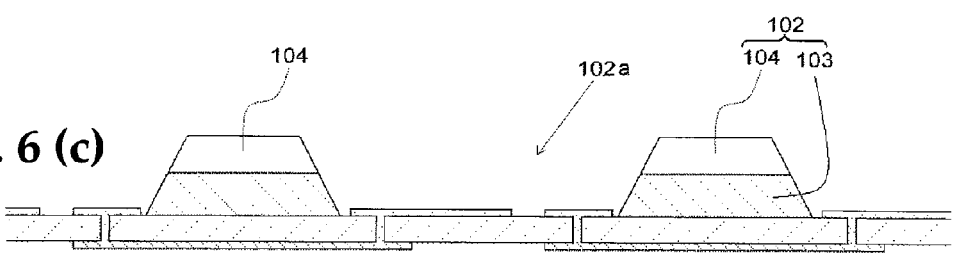
Figure 6:
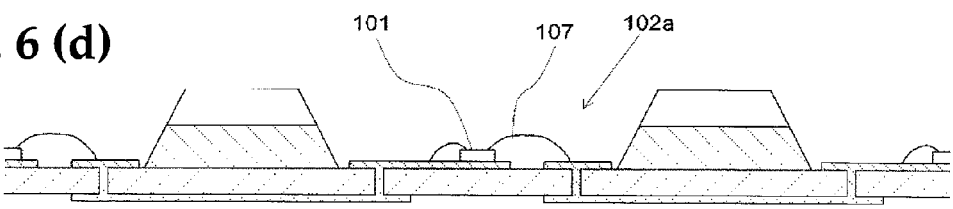
Figure 6:
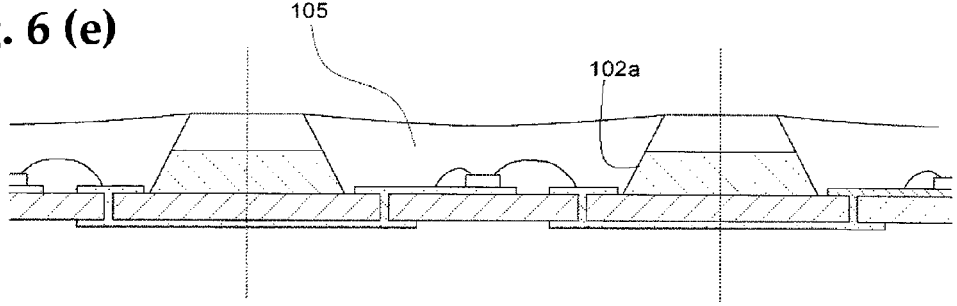

Next, as shown in FIG. 6b, the light reflector 103 is formed by transfer molding. The top and bottom of the composite substrate are sandwiched between transfer molding molds as shown in FIG. 6a. The lower mold is flat, and the upper mold has a concave shape for forming the light reflector 103.

Resin is allowed to flow in through a resin pour hole formed between the upper mold and the substrate 108, and then cured.

In addition to transfer molding, the light reflector 103 can also be formed by compression molding, injection molding, lamination, printing, or another such method.

3. Formation of Light Transmitter 104

Next, as shown in FIG. 6c, the light transmitter 104 is formed by transfer molding in the same manner as the light reflector 103. Here, it is preferable if the light reflector 103 and the light transmitter 104 are formed from a thermosetting resin, because there is little risk that separation will occur at the boundary, and because the resulting light emitting device will comprise a package 102 with excellent heat resistance, light resistance, adhesion, and so forth.

4. Mounting of Light Emitting Element 101

As discussed above, the light emitting element 101 is placed as shown in FIG. 6d at a specific location of the concavity 102a formed by the light reflector 103 and the light transmitter 104, and a specific connection is made with the wire 107.

In this embodiment, the connection is made with the wire 107, but flip-chip joining may be used instead of using a wire. Mounting may also be performed via a sub-mount.

5. Formation of Translucent Sealing Resin 105

Next, as shown in FIG. 6e, the translucent sealing resin 105 is formed by potting on the inside of the concavity 102a of the package 102. The surface of the translucent sealing resin 105 may be concave, convex, or flat. It is undesirable for there to be a difference in the external dimensions due to variance in the amount of the translucent sealing resin 105, so it is better for the packing to result in a slightly concave shape, because mass production will be improved.

6. Dicing

Finally, the composite substrate is diced in a direction perpendicular to the surface of the substrate 108 at the position indicated by the broken line in FIG. 6e, that is, through the substrate 108, the light reflector 103, and the light transmitter 104, to obtain the light emitting device shown in FIG. 1. The shape of the light emitting device may be substantially square or may be a shape that is longer in one direction, as seen in the top face direction of the substrate 108.

Embodiment 2

Figure 3:
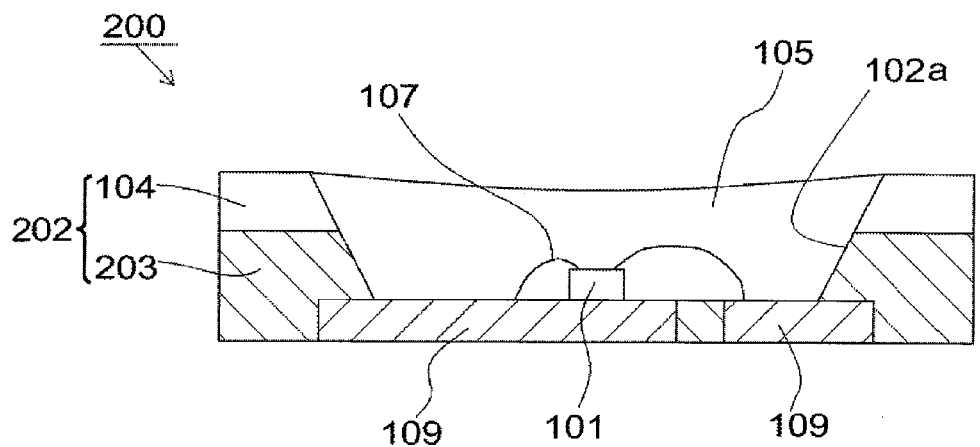
FIG. 3 is a simplified cross section of the light emitting device pertaining to Embodiment 2 of the present invention.
Figure 4:
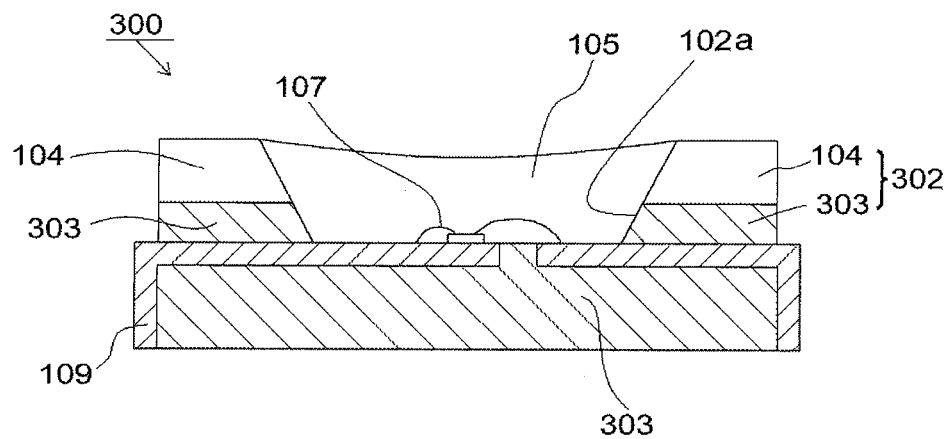
FIG. 4 consists of diagrams of the light emitting device pertaining to Embodiment 3 of the present invention, with (a) being a cross section, (b) an oblique view as seen from a side face side, and (c) an oblique view as seen from the light emitting face side.
Figure 4:
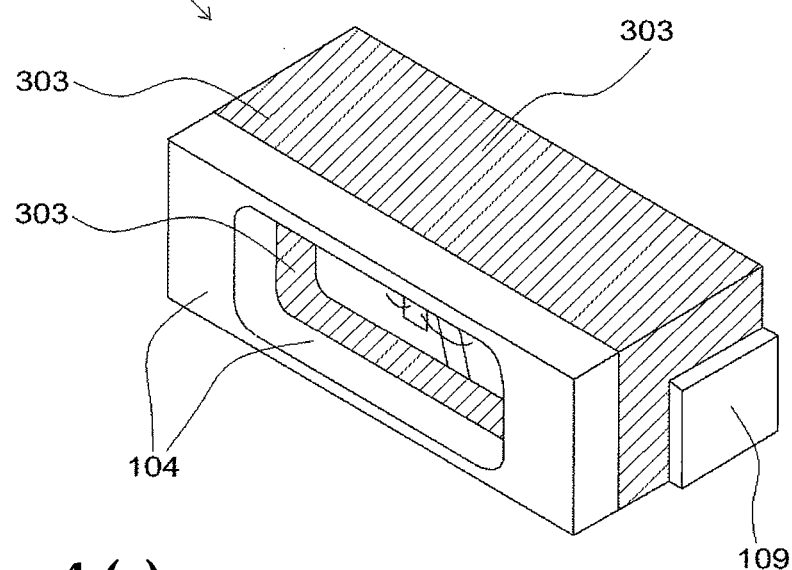
Figure 4:
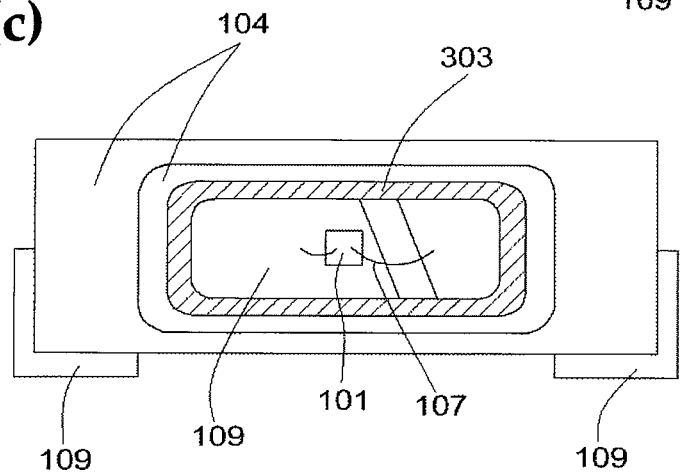

FIG. 3 is a simplified cross section of the light emitting device pertaining to Embodiment 2. Embodiment 2 is substantially the same as Embodiment 1, except that no substrate is used, and instead the light emitting element 101 is placed on a lead frame 109, and the concavity 102a is formed by a package 202 on part of the lead frame 109 so as to surround this light emitting element 101.

A light emitting device with excellent heat diffusion can be obtained by using the lead frame 109 as a conductive member. The lead frame 109 is embedded in a light reflector 203 of the package 202, and the top face of the lead frame 109 appears at the bottom face of the concavity 102a, which forms the package 202 in which the light reflector 203 and/or the light transmitter 104 are formed integrally.

Lead Frame 109

The lead frame 109 may be substantially in the form of a board, but may be in the form of a board that undulates or a board that has bumps. The thickness thereof may be uniform, or the lead frame 109 may be thicker or thinner in portions. There are no particular restrictions on the material of the lead frame 109, but it is preferably formed from a material with a relatively high thermal conductivity. Forming it from such a material allows any heat generated by the light emitting element to be efficiently transmitted and diffused to the outside. For example, when used for a light emitting device, it is preferably a material that has a thermal conductivity of at least about 200 W/(m·K), or one that has relatively high mechanical strength, or one that is easy to punch out, etch, or otherwise work. Specific examples include copper, aluminum, gold, silver, tungsten, iron, nickel, or another such metal, and an iron-nickel alloy, phosphor bronze, or another such alloy. It is particularly favorable for the surface of the lead frame 109 on which the light emitting element 101 is placed to be given a reflective plating so that light can be extracted more efficiently from the light emitting element 101. Just as with the internal wiring 106a, this may be covered over with an insulating, transparent protective film. The light emitting element may also be mounted directly on the surface of the package body, without using this lead frame.

The lead frame sticks outside from the light reflector 203 and is bent, and a light emitting device with wider light distribution can be obtained by disposing it on the side where the light reflector 203 is formed, so as not to be in the way of the light transmitter 104. Conversely, if it is bent to the light transmitter 104 side, then light transmitted by the light transmitter 104 will be reflected by the lead frame, and light extracted to the outside.

Embodiment 3

Embodiment 3 is substantially the same as Embodiment 1, except that the lead frame 109 is used, a light reflector 303 is injection molded, the light transmitter 104 is placed on the light reflector 303, and the result is a frame insert type of light emitting device 300 comprising a package 302.

FIG. 4a is a cross section of the light emitting device 300 in Embodiment 3, FIG. 4b is an oblique view of the device from the outside, and FIG. 4c is a view from the light emitting face side. In FIGS. 4b and 4c, the translucent sealing resin is not shown, and the hatched parts show the places where the light reflector 303 is provided.

As shown in FIGS. 4a and 4b, the lead frame 109 sticks out to the outside from the light reflector 303, and is bent and disposed on the bottom face (the face that serves as the mounting face) and the side faces of the light emitting device 300. Consequently, a side face-emission (a so-called side view) type of light emitting device can be obtained, and a light emitting device that is suited to a thin backlight can be obtained.

In general, when the concavity is made deeper, the lead frame that serves as a terminal is closer to the light emitting face, and there is the risk that the soldering flux will adhere to the light emitting face in secondary mounting, but with the light emitting device of this embodiment, the light emitting face can be farther away from the terminal, which allows this risk to be avoided.

Using this light emitting device 300, a light extraction simulation was conducted in which the depth of the concavity 102a of the package 302 was kept constant while the height of the light reflector 303 and the light transmitter 104 was varied.

Figure 8:
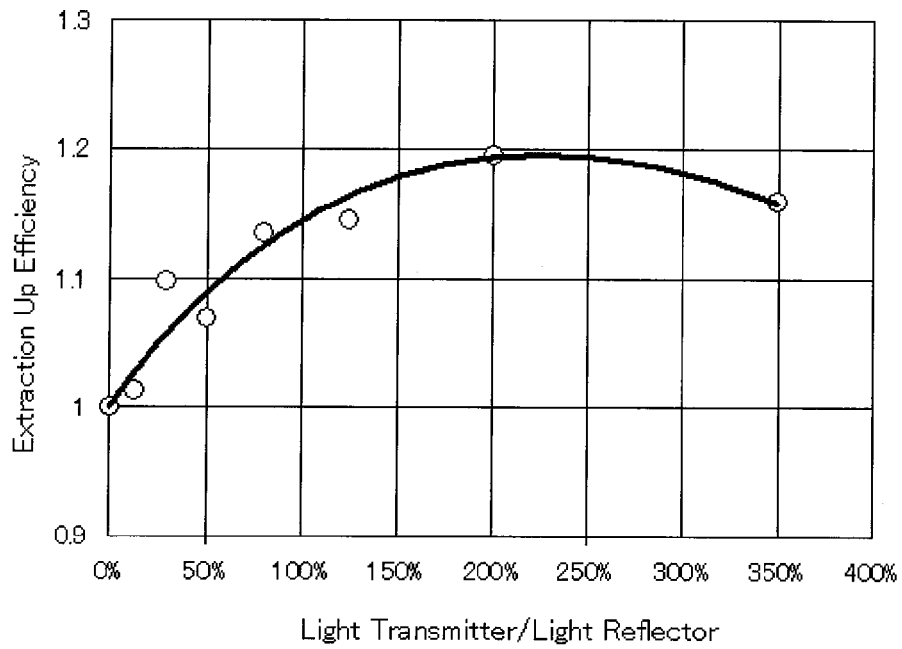
FIG. 8 is a graph of the change in light extraction efficiency when the height ratio for the light transmitter and the light reflector is varied in the light emitting device pertaining to Embodiment 3.

As a result, as shown in FIG. 8, it was confirmed that the extraction efficiency is improved with a light transmitter is provided as compared to a package constituted by just a light reflector, with no light transmitter provided (in which the light transmitter/light reflector ratio is 0%).

In FIG. 8, the depth of the concavity 102a of the package 302 is set to 450 μm, the "light transmitter/light reflector=0%" indicates that no light transmitter is provided, the "light transmitter/light reflector=13%" indicates that the light transmitter is 0.05 μm and the light reflector is 0.4 μm, "29%" indicates that the light transmitter is 0.1 μm and the light reflector is 0.35 μm, "50%" indicates that the light transmitter is 0.15 μm and the light reflector is 0.3 μm, "80%" indicates that the light transmitter is 0.2 μm and the light reflector is 0.25 μm, "125%" indicates that the light transmitter is 0.25 μm and the light reflector is 0.2 μm, "200%" indicates that the light transmitter is 0.3 μm and the light reflector is 0.15 μm, and "350%" indicates that the light transmitter is 0.35 μm and the light reflector is 0.1 μm.

Also, a light emitting element (measuring 700×240 μm, and 120 μm thick) with a main wavelength of 457.5 nm at a drive current of 20 mA was installed, the light reflector was formed from polyphthalamide (PPA) with an optical reflectivity of 93%, and the light transmitter was formed from an epoxy resin with an optical transmissivity of 98%. This optical transmissivity is the transmissivity at the wall thickness used in the simulation (approximately 0.2 mm). A silicone resin was used for the translucent sealing resin. The distance from the light emitting element end to the side wall of the package was approximately 0.13 mm in the widthwise direction and approximately 0.53 mm in the lengthwise direction.

The relative luminosity of the light in the lengthwise direction in this case was also simulated.

Figure 9:
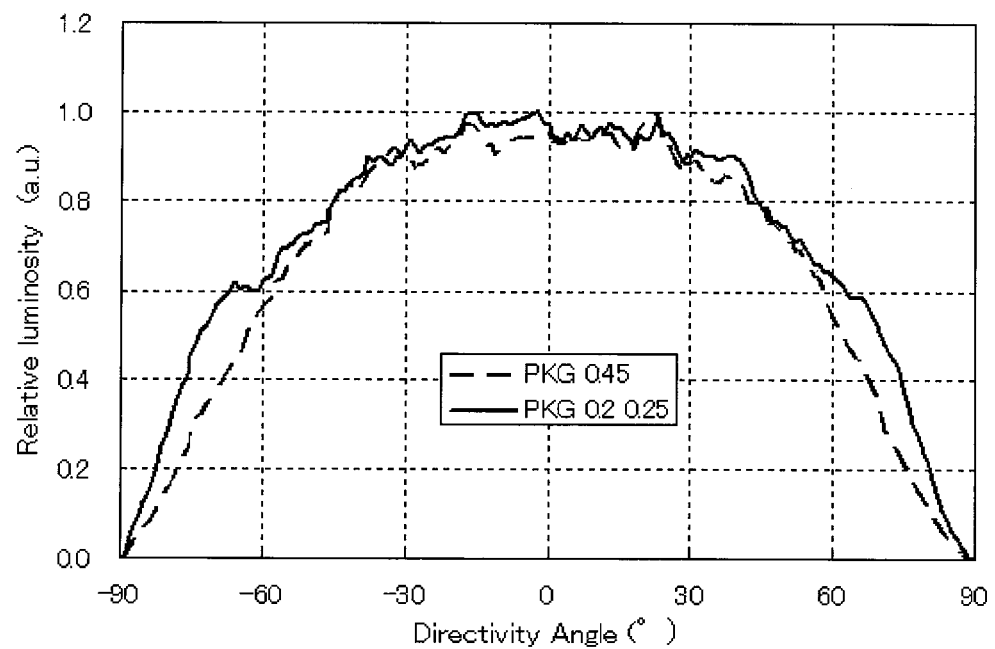
FIG. 9 is a graph of the relative luminosity in the light emitting element lengthwise direction when the light transmitter and the light reflector are set to a specific height ratio in the light emitting device pertaining to Embodiment 3.
Figure 10:
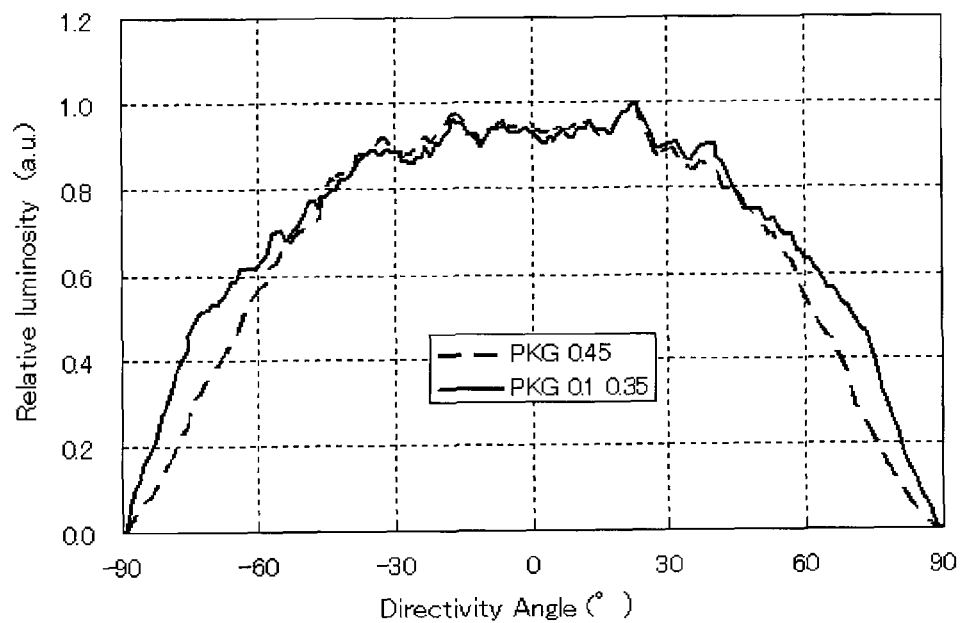
FIG. 10 is a graph of the relative luminosity in the light emitting element lengthwise direction when the light transmitter and the light reflector are set to another specific height ratio in the light emitting device pertaining to Embodiment 3.

As a result, with a light emitting device having a light transmitter of 0.2 μm and a light reflector of 0.25 μm, for example, as shown in FIG. 9, it was confirmed that the light extraction direction widened when a light transmitter was provided as compared to a package (broken line) constituted by just a light reflector, with no light transmitter provided. Also, with a light emitting device having a light transmitter of 0.1 μm and a light reflector of 0.35 μm, as shown in FIG. 10, it was similarly confirmed that the light extraction direction widened.

Embodiment 4

Figure 5:
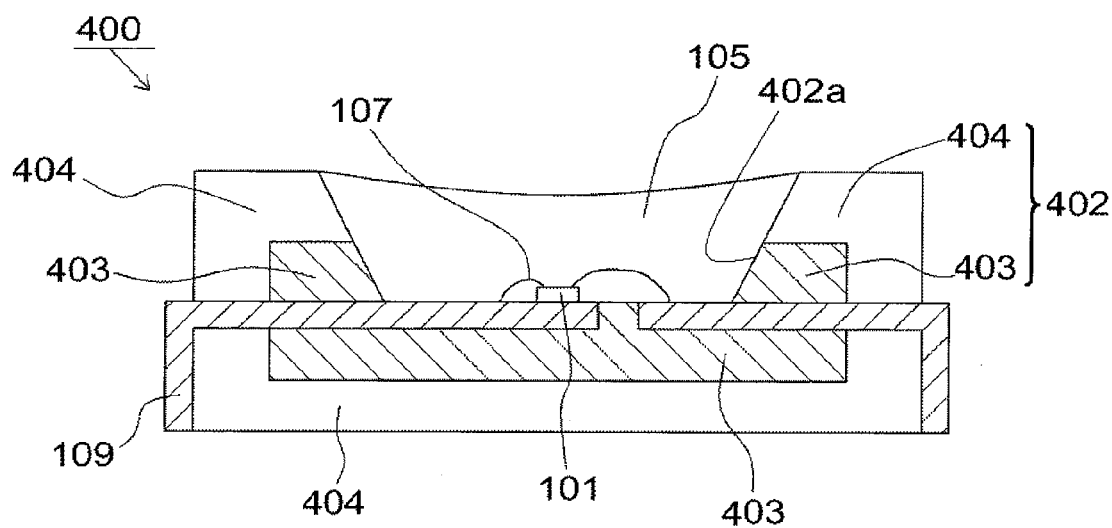
FIG. 5 is a simplified cross section of the light emitting device pertaining to Embodiment 4 of the present invention.

FIG. 5 is a simplified cross section of the light emitting device 400 pertaining to Embodiment 4. In this Embodiment 4, just as in Embodiment 3, the lead frame 109 is used. Everything is substantially the same as in Embodiment 3, except that the area other than the exposed face of a light reflector 403 in a concavity 402a is covered by a light transmitter 404.

Method for Manufacturing Light Emitting Device 400

This light emitting device 400 can be formed as a frame insert type of light emitting device, in which the lead frame is embedded, by the method shown in FIGS. 7a to 7e.

Steps 4 and 5 are the same as in the method for manufacturing the above-mentioned light emitting device 100, and therefore will not be described again in detail.

1. Disposition of Lead Frame 109

Figure 7:
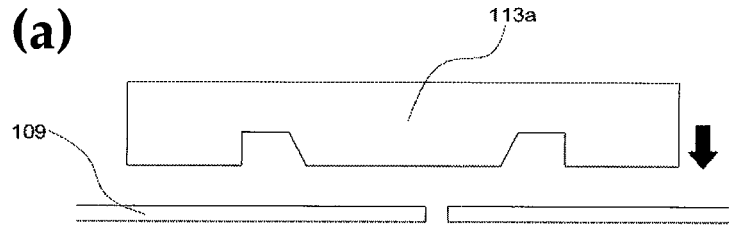
FIG. 7 consists of diagrams illustrating a method for manufacturing the light emitting device pertaining to Embodiment 4.
Figure 7:
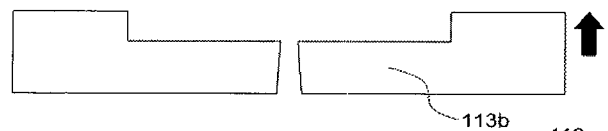
Figure 7:
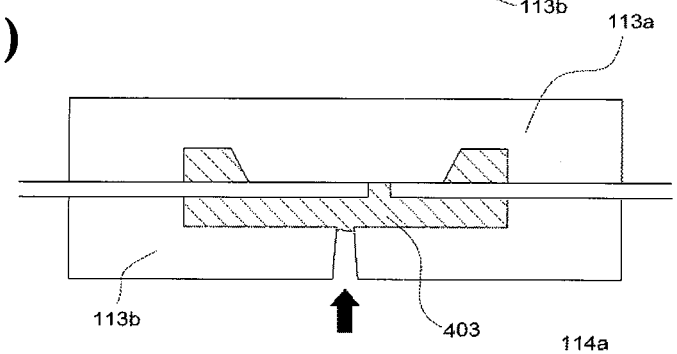
Figure 7:
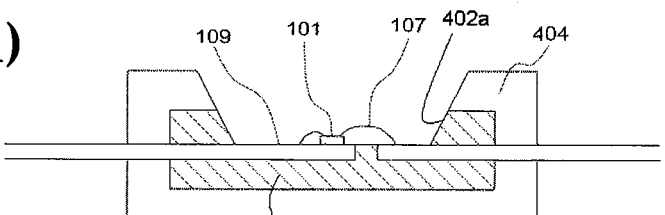
Figure 7:
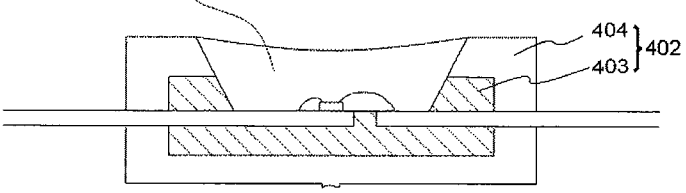

First, as shown in FIG. 7a, the lead frame 109 that serves as the positive and negative electrodes is sandwiched between an upper mold 113a and a lower mold 113b in the direction of the arrow.

2. Formation of Light Reflector 403

Next, as shown in FIG. 7b, resin is poured in through a resin inlet provided to the lower part of the lower mold 113b, and injection molding is performed.

3. Formation of Light Transmitter 404

After the light reflector 403 is cured, a light transmitter 404 is injection molded as shown in FIG. 7c using an upper mold 114a and a lower mold 114b capable of forming a cavity that is larger than the cavity formed by the upper mold 113a and the lower mold 113b. Using a thermoplastic resin is preferable in that this two-color molding can be easily accomplished by injection molding.

4. Mounting of Light Emitting Element 101

As shown in FIG. 7d, the light emitting element 101 is placed on the surface of the lead frame 109, inside the concavity 402a of the package 402 formed by the light reflector 103 and the light transmitter 104 as discussed above, and specific connections are made.

5. Formation of Translucent Sealing Resin 105

Next, as shown in FIG. 7e, the translucent sealing resin 105 is formed by potting.

6. Forming

Finally, the lead frame 109 is cut into specific lengths and bent to produce external terminals.

Embodiment 5

Figure 11:
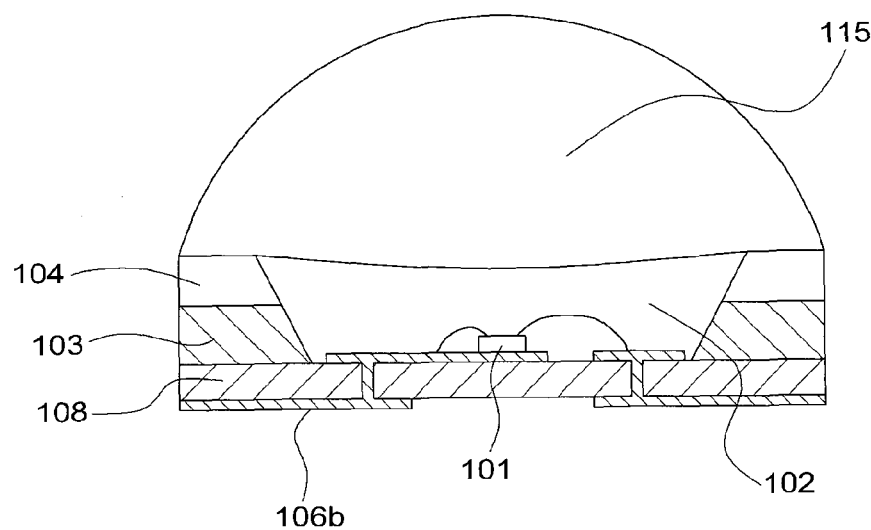
FIG. 11 is a simplified cross section of the light emitting device pertaining to Embodiment 5.

FIG. 11 shows a lens 115 combined with the light emitting device of Embodiment 1. Thus providing the lens 115 so as to cover the translucent sealing resin 105 and the light transmitter 104 allows a light emitting device to be obtained which has a portion in which light is extracted via the lens 115, and a portion in which light is extracted laterally via the light transmitter 104, without going through the lens 115.

A lens can be similarly combined with the light emitting devices of Embodiments 2 to 4.

There are no particular restrictions on the material of the lens 115, as long as it is translucent, but it can be selected from among materials normally used in this field, such as one or more types of resin such as polyolefin resins, polycarbonate resins, polystyrene resins, epoxy resins, acrylic resins, acrylate resins, methacrylic resins (PMMA, etc.), urethane resins, polyimide resins, polynorbornene resins, fluororesins, silicone resins, modified silicone resins, modified epoxy resins, glass epoxy resins, as well as liquid crystal polymers, glass, and so forth. Of these, an epoxy, silicone, modified silicone, urethane resin, oxetane resin, or the like is favorable.

The light emitting device of the illustrated embodiments can be used for various light sources, such as lighting fixtures, displays, portable telephone backlights, auxiliary light sources for moving picture illumination, and other general, consumer-use light sources.

DESCRIPTION OF THE NUMERALS

100, 200, 300, 400: light emitting device; 101: light emitting element; 102, 202, 302, 402: package; 102a, 402a: concavity; 103, 203, 303, 403: light reflector; 104, 404: light transmitter; 105: translucent sealing resin; 106a: internal wiring; 106b: external electrode; 107: wire; 108: substrate; 109: lead frame; 110: fluorescent substance; 113a, 114a: upper mold; 113b, 114b: lower mold; 115: lens.

The invention claimed is:

1. A light emitting device comprising:
a light emitting element; and
a package having
   a light reflector layer configured and arranged such that a surface of the light reflector layer reflects light from the light emitting element, and
   a light transmitter layer integrally formed on the light reflector layer, and configured and arranged to transmit light from the light emitting element to the outside, the light reflector layer and the light transmitter layer collectively define a concavity for holding the light emitting element, with a side wall of the concavity being partially formed by the surface of the light reflector layer and partially formed by a surface of the light transmitter layer.

2. The light emitting device according to claim 1, wherein a translucent sealing resin is packed inside the concavity.

3. The light emitting device according to claim 2, wherein the translucent sealing resin is formed from a different material from that of the light transmitter layer.

4. The light emitting device according to claim 2, wherein a refractive index of the light transmitter layer is different from a refractive index of the translucent sealing resin.

5. The light emitting device according to claim 2, wherein the translucent sealing resin is formed by potting on the inside of the concavity.

6. The light emitting device according to claim 1, wherein the light reflector layer is formed from a white resin, and the light transmitter layer is formed from a transparent resin with a light transmissivity of at least 70%.

7. The light emitting device according to claim 1, wherein the height of the light reflector layer is at least 100% of the height of the light emitting element.

8. The light emitting device according to claim 1, wherein the height of the light transmitter layer is at least 30% of the height of the light reflector layer.

9. The light emitting device according to claim 1, wherein the translucent sealing resin contains a fluorescent material.

10. The light emitting device according to claim 1, wherein the side wall of the concavity includes a stepped face formed at an interface between the light transmitter layer and the light reflector layer.

11. The light emitting device according to claim 1, wherein a surface of the light reflector layer forming a part of the side wall of the concavity and a surface of the light transmitter layer forming another part of the side wall of the concavity are inclined at mutually different angles.

12. The light emitting device according to claim 1, wherein the light reflector layer and the light transmitter layer are formed from thermosetting resin.

13. The light emitting device according to claim 1, wherein the light reflector layer comprises a thermosetting resin.

14. A light emitting device comprising:
a light emitting element;
a package having
   a light reflector layer configured and arranged such that a surface of the light reflector layer reflects light from the light emitting element, and
   a light transmitter layer formed on the light reflector layer, and configured and arranged to transmit light from the light emitting element to the outside,
   the light reflector layer and the light transmitter layer collectively define a concavity for holding the light emitting element, with a side wall of the concavity being partially formed by the surface of the light reflector layer and partially formed by a surface of the light transmitter layer; and
a translucent sealing resin that is packed on the inside of the concavity.

15. The light emitting device according to claim 14, wherein the translucent sealing resin is formed from a different material from that of the light transmitter layer.

16. The light emitting device according to claim 14, wherein the light reflector layer is formed from a white resin, and the light transmitter layer is formed from a transparent resin with a light transmissivity of at least 70%.

17. The light emitting device according to claim 14, wherein the height of the light reflector layer is at least 100% of the height of the light emitting element.

18. The light emitting device according to claim 14, wherein the height of the light transmitter layer is at least 30% of the height of the light reflector layer.

19. The light emitting device according to claim 14, wherein the translucent sealing resin contains a fluorescent material.

20. The light emitting device according to claim 14, wherein the side wall of the concavity includes a stepped face formed at an interface between the light transmitter layer and the light reflector layer.

21. The light emitting device according to claim 14, wherein a surface of the light reflector layer forming a part of the side wall of the concavity and a surface of the light transmitter layer forming another part of the side wall of the concavity are inclined at mutually different angles.

22. The light emitting device according to claim 14, wherein the light reflector layer and the light transmitter layer are formed from thermosetting resin.

23. The light emitting device according to claim 14, wherein a refractive index of the light transmitter layer is different from a refractive index of the translucent sealing resin.

24. The light emitting device according to claim 14, wherein the translucent sealing resin is formed by potting on the inside of the concavity.

25. The light emitting device according to claim 14, wherein the light reflector layer comprises a thermosetting resin.

26. A package for a light emitting device including a light emitting element, the package comprising:

a light reflector layer configured and arranged to reflect light from the light emitting element; and a light transmitter layer formed on the light reflector layer, and configured and arranged to transmit light from the light emitting element to the outside, the light reflector layer and the light transmitter layer collectively defining a concavity for holding the light emitting element, with a side wall of the concavity being partially formed by a surface of the light reflector layer and partially formed by a surface of the light transmitter layer.

27. The package for a light emitting device according to claim 26, wherein the light reflector layer comprises a thermosetting resin.

* * * * *